(12) United States Patent
Chu et al.

(10) Patent No.: US 8,988,120 B2
(45) Date of Patent: Mar. 24, 2015

(54) FREQUENCY MULTIPLIER AND SIGNAL FREQUENCY-MULTIPLYING METHOD

(71) Applicant: MStar Semiconductor, Inc., Hsinchu Hsien (TW)

(72) Inventors: Shu-Wei Chu, Hsinchu County (TW); Yao-Chi Wang, Hsinchu County (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/143,204

(22) Filed: Dec. 30, 2013

(65) Prior Publication Data

US 2014/0184282 A1 Jul. 3, 2014

(30) Foreign Application Priority Data

Jan. 2, 2013 (TW) .............................. 102100050 A (51) Int. Cl.
```
H03B 19/00      (2006.01)
H03B 19/14      (2006.01)
H03B 19/10      (2006.01)
H03B 19/06      (2006.01)
```
(52) U.S. Cl.
CPC ................ *H03B 19/14* (2013.01); *H03B 19/10* (2013.01); *H03B 19/06* (2013.01); *H03B 19/00* (2013.01)

USPC ........................................................ 327/120

(58) Field of Classification Search
CPC ........ H03B 19/00; H03B 19/03; H03B 19/06; H03B 19/10; H03B 19/14
USPC ......... 327/120, 110, 113, 116, 119, 122, 355, 327/359, 361, 403, 404, 407, 408, 409
See application file for complete search history.

(56) References Cited

U.S. PATENT DOCUMENTS

2008/0169859 A1* 7/2008 Garcia et al. .................. 327/355

* cited by examiner

*Primary Examiner* — Lincoln Donovan
*Assistant Examiner* — Jung Kim
(74) *Attorney, Agent, or Firm* — WPAT, PC; Justin King (57) ABSTRACT

A frequency multiplier includes a first impedance module, a second impedance module, a first path and a second path. When the first path is conducted, the first impedance module generates a first output signal and the second impedance module generates a second output signal. When the second path is conducted, the first impedance module generates a third output signal and the second impedance module generates a fourth output signal. The first and second paths are not conducted simultaneously. A frequency of a first combination signal generated from the first and third output signals and a frequency of a second combination signal generated from the second and fourth output signals are N times of a frequency of the input signal, where N is a positive rational number.

13 Claims, 7 Drawing Sheets

FREQUENCY MULTIPLIER AND SIGNAL FREQUENCY-MULTIPLYING METHOD

This application claims the benefit of Taiwan application Serial No. 102100050, filed Jan. 2, 2013, the subject matter of which is incorporated herein by reference.

BACKGROUND OF THE INVENTION

1. Field of the Invention

The invention relates in general to a frequency multiplier and a signal frequency-multiplying method, and more particularly, to a frequency multiplier and a signal frequency-multiplying method capable of reducing power consumption.

2. Description of the Related Art

In the prior art, the frequency of a signal is usually multiplied by a multiplier. However, as the multiplier frequently generates only one single signal, an additional circuit is to be added if generating differential signals is desired. As such, not only electric power consumption but also a circuit area is increased.

SUMMARY OF THE INVENTION

The invention is directed to a frequency multiplier and a signal frequency-multiplying method capable of generating differential signals without utilizing an additional circuit.

According to an embodiment of the present invention, a frequency multiplier is provided. The frequency multiplier comprises: a first output end; a second output end; a first impedance module, having one end coupled to a first predetermined potential level and the other end coupled to the first output end; a second impedance module, having one end coupled to a second predetermined potential level and the other end coupled to the second output end; a first path, coupled between the first output end and the second output end; and a second path, coupled between the first output end and the second output end. The first path and the second path receive an input signal and an inverted input signal, respectively. A phase of the inverted input signal is inverted to a phase of the input signal. The first path and the second path are conducted or non-conducted according to the input signal and the inverted input signal. When the first path is conducted, a first current flows from the first impedance module and passes along the first path to enter the second impedance module, so that the first impedance module generates a first output signal at the first output end and the second impedance module generates a second output signal at the second output end. When the second path is conducted, a second current flows from the first impedance module and passes along the second path to enter the second impedance module, so that the first impedance module generates a third output signal at the first output end and the second impedance module generates a fourth output signal at the second output end. The first path and the second path are not conducted simultaneously. A frequency of a first combination signal generated from the first and third output signals and a frequency of a second combination signal generated from the second and fourth output signals are an N times of a frequency of the input signal, where N is a positive rational number.

According to another embodiment of the present invention, a signal frequency-multiplying method for a frequency multiplier is provided. The frequency multiplier comprises a first path, a second path, a first impedance module and a second impedance module. The frequency-multiplying method comprises: receiving an input signal and an inverted input signal by the first path and the second path, respectively, wherein a phase of the inverted input signal is inverted to a phase of the input signal, and the first path and the second path are conducted or non-conducted according to the input signal and the inverted input signal; when the first path is conducted, rendering a first current to flow from the first impedance module and pass along the first path to enter the second impedance module, so that the first impedance module generates a first output signal at a first output end and the second impedance module generates a second output signal at a second output end; when the second path is conducted, rendering a second current to flow from the first impedance module and pass along the second path to enter the second impedance module, so that the first impedance module generates a third output signal at the first output end and the second impedance module generates a fourth output signal at the second output end; generating a first combination signal by combining the first output signal and the second output signal; and generating a second combination signal by combining the third output signal and the fourth output signal. The first path and the second path are not conducted simultaneously. A frequency of the first combination signal and a frequency of a second combination signal are N times of a frequency of the input signal, where N is a positive rational number.

Without implementing an additional circuit, the above embodiments are capable of generating frequency-multiplied differential signals as well as reducing power consumption and a circuit area.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
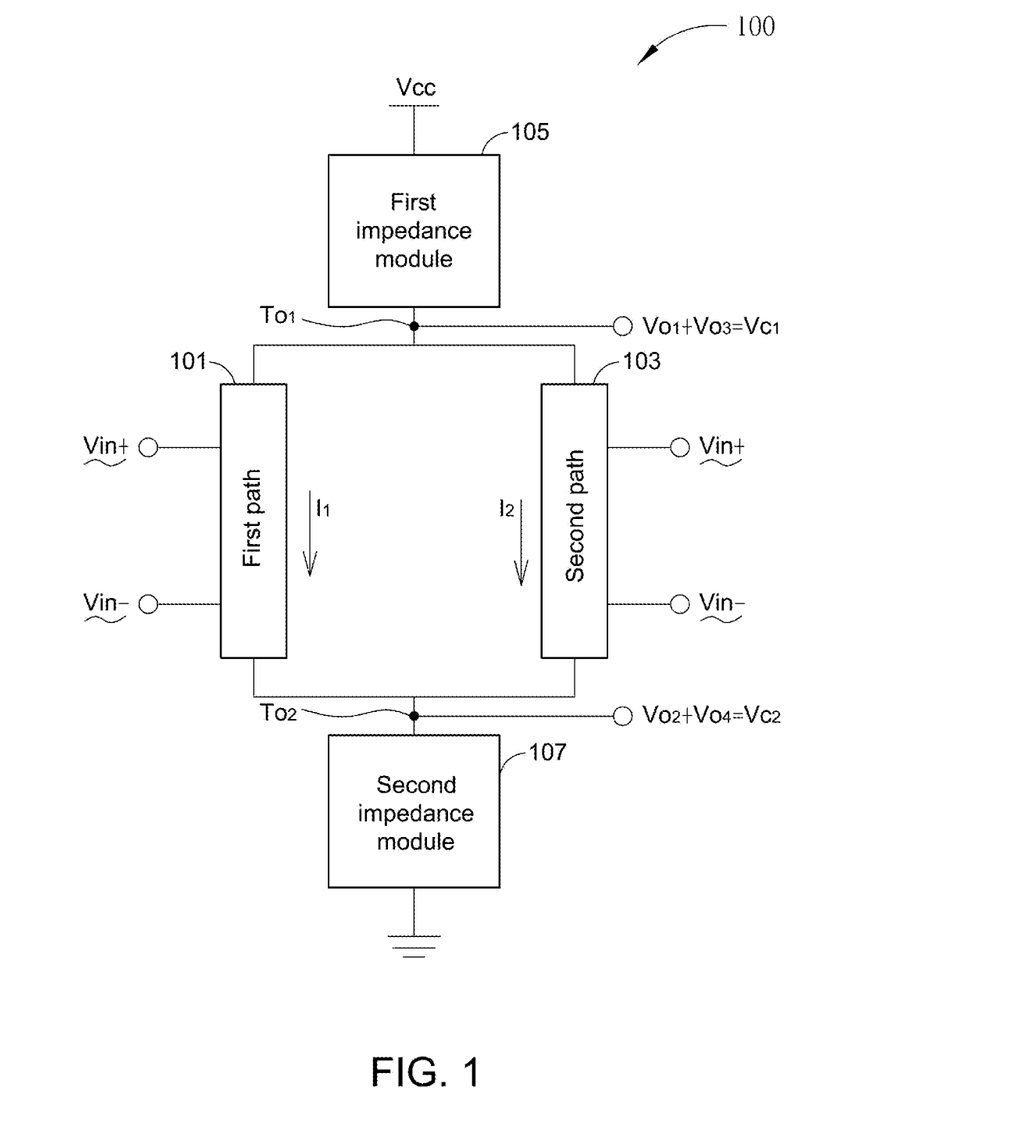
FIG. 1 is a frequency multiplier according to an embodiment of the present invention.

FIG. 1 shows a frequency multiplier 100 according to an embodiment of the present invention. As shown in FIG. 1, the frequency multiplier 100 comprises a first output end $T_{o1}$, a second output end $T_{o2}$, a first path 101, a second path 103, a first impedance module 105, and a second impedance module 107. The first path 101 and the second path 103, both coupled between the first output end $T_{o1}$ and the second output end $T_{o2}$, receive an input signal $V_{in+}$ and an inverted input signal $V_{in-}$, respectively. The phase of the inverted input signal $V_{in-}$ is inverted to the phase of the input signal $V_{in+}$. The first path 101 and the second path 103 are conductive or non-conductive according to the input signal $V_{in-}$ and the input signal $V_{in+}$. When the first path 101 is conducted, a first current $I_1$ flows from the first impedance module 105 and passes along the first path 101 to the second impedance module 107, so that the first impedance module 101 generates a first output signal $V_{o1}$ at the first output end $T_{o1}$ and the second impedance module 107 generates a second output signal $V_{o2}$ at the second output end $T_{o2}$. When the second path 103 is conducted, a second current $I_2$ flows from the first impedance module 105 and passes along the second path 103 to the second impedance module 107, so that the first impedance module 105 generates a third output signal $V_{o3}$ at the first output end $T_{o1}$ and the second impedance module 107 generates a fourth output signal $V_{o4}$ at the second output end $T_{o2}$. The first output signal $V_{o1}$ and the third output signal $V_{o3}$ are combined to generate a first combination signal $V_{c1}$; the second output signal $V_{o2}$ and the fourth output signal $V_{o4}$ are combined to generate a second combination signal $V_{c2}$. The first path 101 and the second path 103 are not simultaneously conducted. The frequency of the first combination signal $V_{c1}$ and the frequency of the second combination signal $V_{c2}$ are N times of the frequency of the input signal $V_{in+}$ or the inverted input signal $V_{in-}$, where N is a positive rational number.

Figure 2:
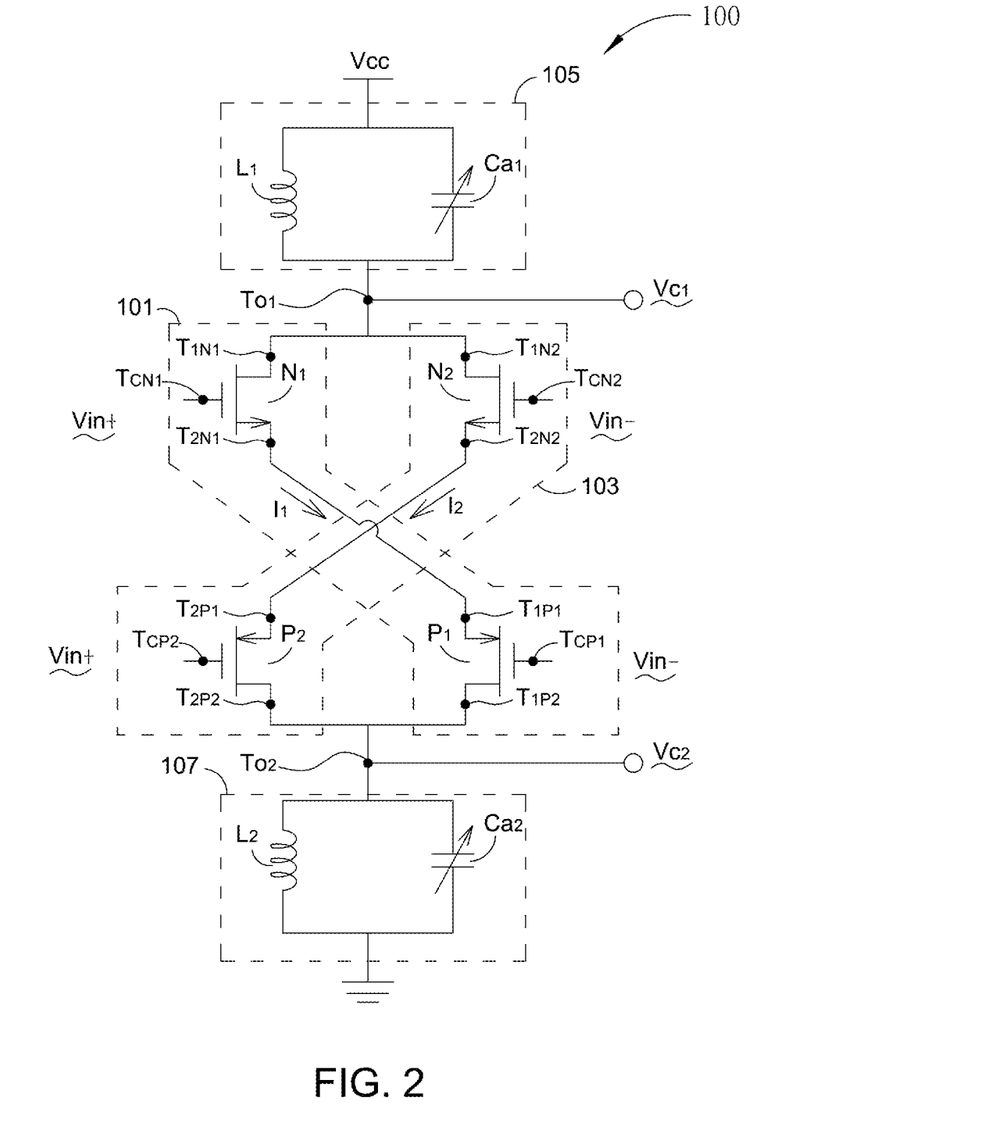
FIG. 2 is a detailed exemplary circuit of the frequency multiplier in FIG. 1.

FIG. 2 shows a detailed exemplary circuit of the frequency multiplier shown in FIG. 1. As shown in FIG. 2, the first path 101 of the frequency multiplier 100 comprises a first N-type metal-oxide-semiconductor field-effect transistor (NMOSFET) $N_1$ and a P-type metal-oxide-semiconductor field-effect transistor (PMOSFET) $P_1$. The second path 103 comprises a second NMOSFET $N_2$ and a second PMOSFET $P_2$. The first impedance module 105 comprises an inductor $L_1$ and a capacitor $C_{a1}$; the second impedance module 107 comprises an inductor $L_2$ and a capacitor $C_{a2}$. The first NMOSFET $N_1$ comprises a first end $T_{1N1}$, a second end $T_{2N1}$ and a control end $T_{CN1}$. The first PMOSFET $P_1$ comprises a first end $T_{1P1}$, a second end $T_{2P1}$ and a control end $T_{CP1}$. The second NMOSFET $N_2$ comprises a first end $T_{1N2}$, a second end $T_{2N2}$ and a control end $T_{CN2}$. The second PMOSFET $P_2$ comprises a first end $T_{1P2}$, a second end $T_{2P2}$ and a control end $T_{CP2}$. Detailed connections between the components are as depicted in FIG. 2, and shall be omitted herein. It should be noted that the NMOSFETs and PMOSFETs can be replaced by other types of transistors.

Figure 3:
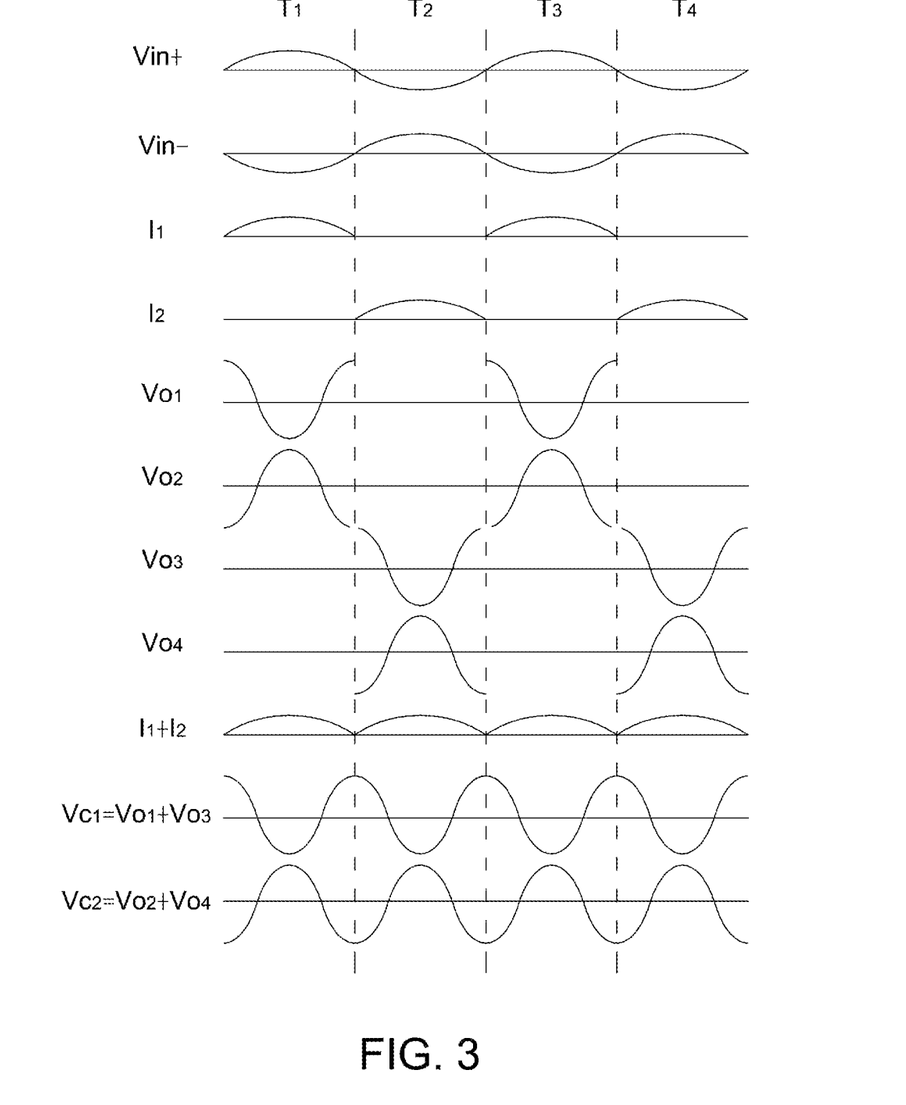
FIG. 3 is a schematic diagram depicting relations between currents and signals in the frequency multiplier in FIG. 2.

FIG. 3 shows a schematic diagram of relations between the currents and signals of the frequency multiplier in FIG. 2. Referring to both FIGS. 2 and 3 for operations of the frequency multiplier shown in FIG. 2, the control end $T_{CN1}$ of the first NMOSFET $N_1$ and the control end $T_{CP1}$ of the first PMOSFET $P_1$ of the first path 101 receive the input signal $V_{in+}$ and the inverted input signal $V_{in-}$, respectively. Thus, the first path 101 is conducted when the input signal $V_{in+}$ is at a high potential level and when the inverted input signal $V_{in-}$ is at a low potential level (periods $T_1$ and $T_3$ in FIG. 3). The control end $T_{CN2}$ of the second NMOSFET $N_2$ and the control end $T_{CP2}$ of the second PMOSFET $P_2$ of the second path 103 receive the inverted input signal $V_{in-}$ and the input signal $V_{in+}$, respectively. Thus, the second path 103 is conducted when the input signal $V_{in+}$ is at a low potential level and when the inverted input signal $V_{in-}$ is at a high potential level (periods $T_2$ and $T_4$ in FIG. 3). When the first path 101 is conducted, with the inductors $L_1$ and $L_2$ of the first impedance module 105 and the second impedance module 107, the first output signal $V_{o1}$ and the second output signal $V_{o2}$ are generated from resonance, as shown in FIG. 3. Similarly, when the second path 103 is conducted, with the inductors $L_1$ and $L_2$ of the first impedance module 105 and the second impedance module 107, the third output signal $V_{o3}$ and the fourth output signal $V_{o4}$ are generated from resonance, as shown in FIG. 3. Through the foregoing operations, the first combination signal $T_{c1}$ is generated at the first output end $T_1$, and the second combination signal $T_{c2}$ is generated at the second output end $T_2$. The first combination signal $T_{c1}$ is generated by combining the first output signal $V_{o1}$ and the third output signal $V_{o3}$, the second combination signal $T_{c2}$ is generated by combining the second output signal $V_{o2}$ and the fourth output signal $V_{o4}$.

In the embodiment, since the first combination signal $T_{c1}$ and the second combination signal $T_{c2}$ are generated by resonance of the input signal $V_{in+}$ and the inverted input signal $V_{in-}$, the frequencies of the first combination signal $T_{c1}$ and the second combination signal $T_{c2}$ display an integral multiple relationship with the frequencies of the input signal $V_{in+}$ and the inverted input signal $V_{in-}$. In this example, the frequencies of the first combination signal $T_{c1}$ and the second combination signal $T_{c2}$ are twice of the frequencies of the input signal $V_{in+}$ and the inverted input signal $V_{in-}$. By modifying the inductance values or capacitance values in the first impedance module 105 and the second impedance module 107, the relationship between the two frequencies of the combination signals and the input signals may also be adjusted. More specifically, the frequencies of the first combination signal $T_{c1}$ and the second combination signal $T_{c2}$ are N times of the frequencies of the input signal $V_{in+}$ and the inverted input signal $V_{in-}$, where N is a positive rational number.

Figure 4:
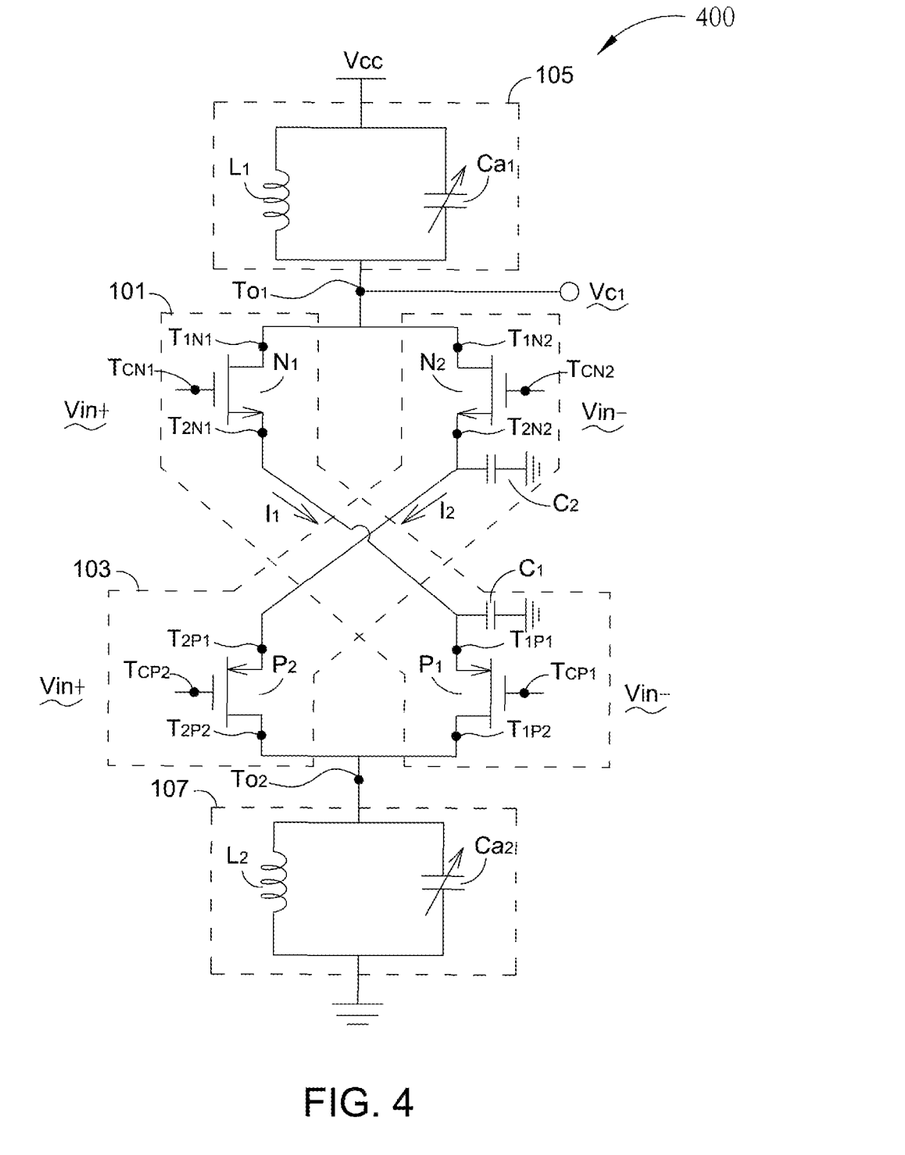
FIGS. 4 to 6 are other detailed exemplary circuits of the frequency multiplier in FIG. 1.
Figure 5:
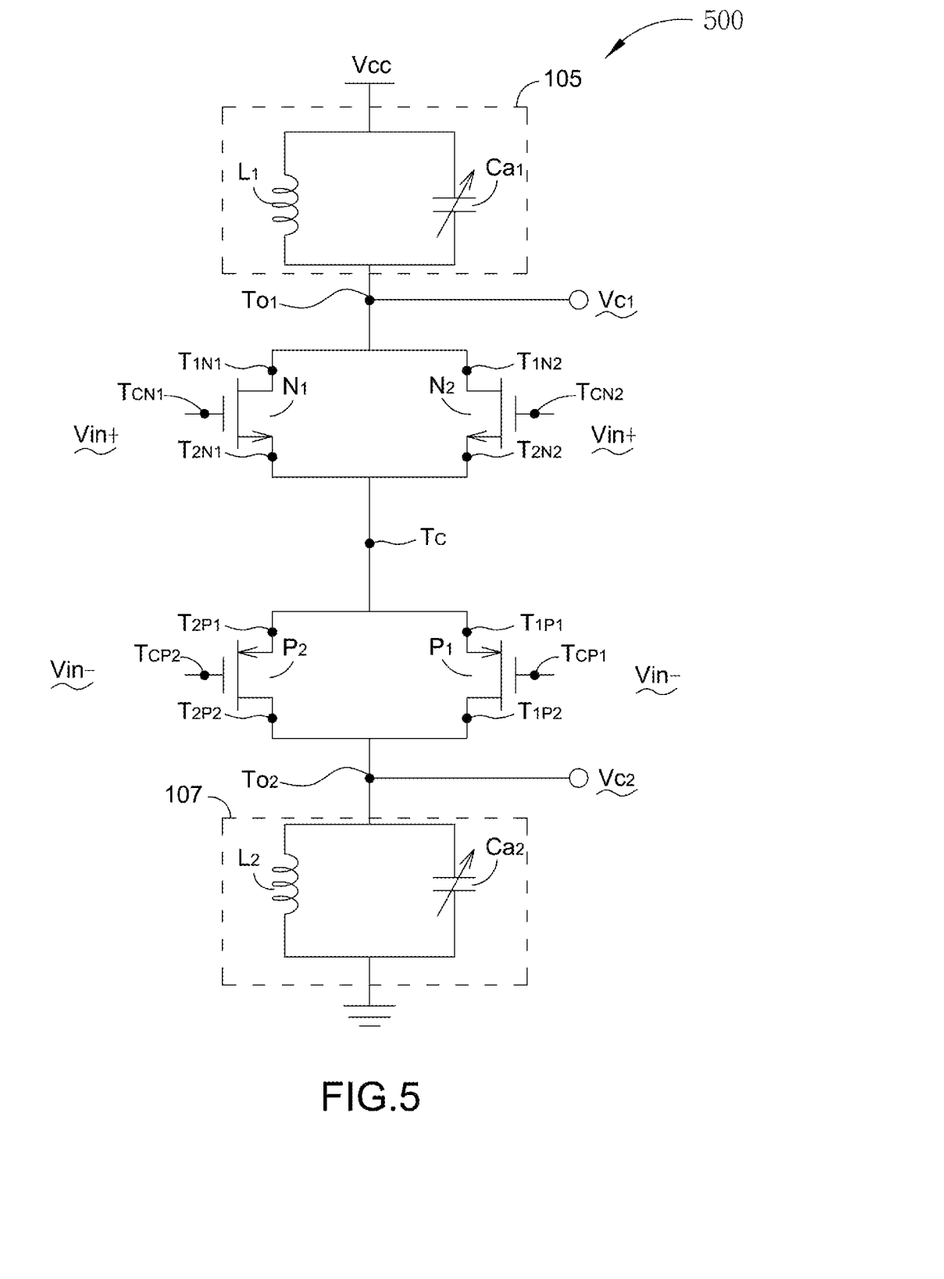
Figure 6:
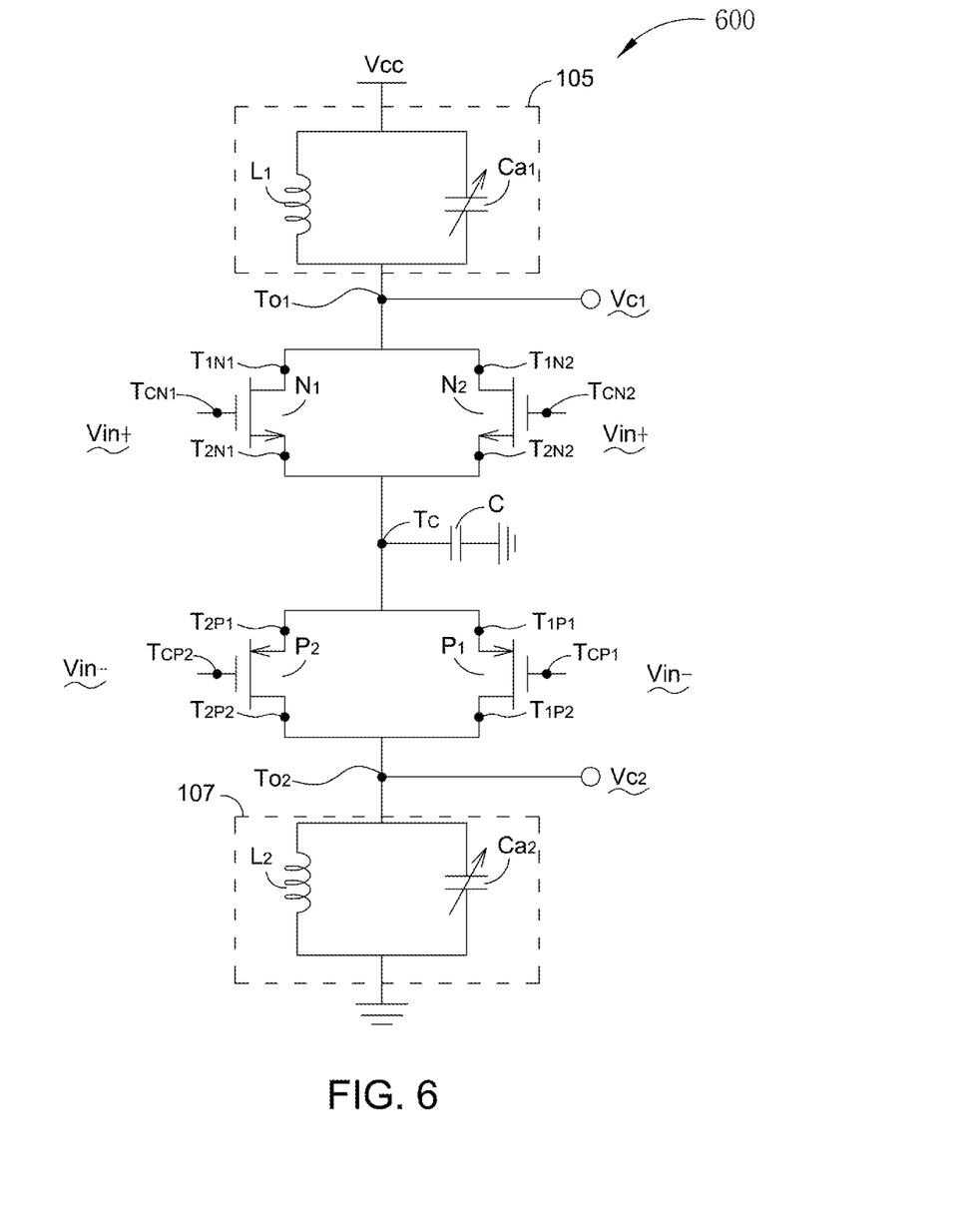

FIGS. 4 to 6 are other detailed exemplary circuits of the frequency multiplier in FIG. 1. In FIG. 4, a frequency multiplier 400 further includes capacitors $C_1$ and $C_2$. The capacitor $C_1$ has one end coupled to the second end $T_{2N2}$ of the second NMOSFET $N_2$ and the other end coupled to ground. The capacitor $C_2$ has one end coupled to the second end $T_{2N2}$ of the second NMOSFET $N_2$ and the other end coupled to ground. Through the above structure, noises may be reduced while the current is kept stable. Again referring to FIG. 2, the second ends $T_{2N1}$ and $T_{2N2}$ of the first NMOSFET $N_1$ and the second NMOSFET $N_2$ are not coupled to each other, and the second ends $T_{2P1}$ and $T_{2P2}$ of the first PMOSFET $P_1$ and the second PMOSFET $P_2$ are not coupled to each other. In an embodiment shown in FIG. 5, in a frequency multiplier 500, the second ends $T_{2N1}$ and $T_{2N2}$ of the first NMOSFET $N_1$ and the second NMOSFET $N_2$ as well as the second ends $T_{2P1}$ and $T_{2P2}$ of the first PMOSFET $P_1$ and the second PMOSFET $P_2$ are coupled to a same connection point $T_c$. Through the structure in FIG. 5, circuit designs can be simplified. In an embodiment in FIG. 6, a frequency multiplier 600 further includes a capacitor C, which has one end coupled to the connection point $T_c$ and the other end coupled to ground. Through the structure in FIG. 6, noises may be reduced while the current is kept stable.

Figure 7:
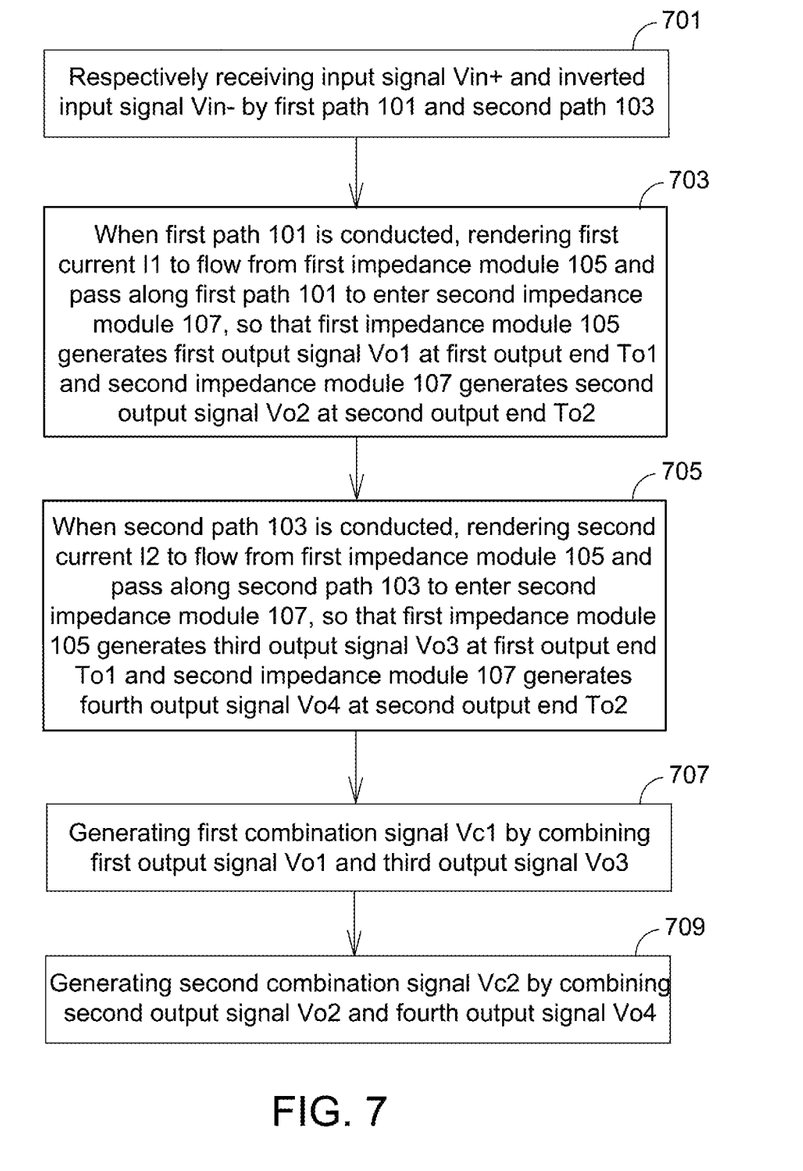
FIG. 7 is a signal frequency-multiplying method according to an embodiment of the present invention.

Based on the above embodiments, a signal frequency-multiplying method is provided, as shown in FIG. 7.

In step 701, an input signal $V_{in+}$ and an inverted input signal $V_{in-}$ are received by a first path 101 and a second path 103, respectively. The phase of the inverted input signal $V_{in-}$ is inverted to the phase of the input signal $V_{in+}$. The first path 101 and the second path 103 are conducted or non-conducted according to the input signal $V_{in+}$ and the inverted input signal $V_{in-}$.

In step 703, when the first path 101 is conducted, a first current $I_1$ flows from a first impedance module 105 and passes along the first path 101 to a second impedance module 107, so that the first impedance module 105 generates a first output signal $V_{o1}$ at the first output end $T_{o1}$ and the second impedance module 107 generates a second output signal $V_{o2}$ at a second output end $T_{o2}$.

In step 705, when the second path 103 is conducted, a second current $I_2$ flows from the first impedance module 105 and passes along the second path 103 to the second impedance module 107, so that the first impedance module 105 generates a third output signal $V_{o3}$ at the first output end $T_{o1}$ and the second impedance module 107 generates a fourth output signal $V_{o4}$ at a second output end $T_{o2}$.

In step 707, a first combination signal $V_{c1}$ is generated by combining the first output signal $V_{o1}$ and the third output signal $V_{o3}$.

In step 709, a second combination signal $V_{c2}$ is generated by combining the second output signal $V_{o2}$ and the fourth output signal $V_{o4}$.

The first path 101 and the second path 103 are not conducted simultaneously, and the frequencies of the first combination signal $V_{c1}$ and the second combination signal $V_{c2}$ are N times of that of the input signal, where N is a positive rational number.

The first combination signal $V_{c1}$ and the second combination signal $V_{c2}$ may be a pair of differential signals, or two independent signals. Thus, the foregoing frequency multiplier may be regarded as a frequency multiplier capable of generating differential signals, or as a frequency multiplier for generating two independent signals.

Without implementing an additional circuit, the above embodiments are capable of generating frequency-multiplied differential signals as well as reducing power consumption and a circuit area.

While the invention has been described by way of example and in terms of the preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A frequency multiplier, comprising:
   a first output end;
   a second output end;
   a first impedance module, having one end coupled to a first predetermined potential level and one other end coupled to the first output end;
   a second impedance module, having one end coupled to a second predetermined potential level and one other end coupled to the second output end;
   a first path, coupled between the first output end and the second output end;
   a second path, coupled between the first output end and the second output end;
   wherein the first path and the second path receive an input signal and an inverted input signal, respectively;
   wherein the first path comprises a first first-type transistor, which has a first end coupled to the first output end, a second end, and a control end for receiving the input signal, the first path further comprises a first second-type transistor, which has a first end coupled to the second end of the first first-type transistor, a second end coupled to the second output end, and a control end for receiving the inverted input signal;
   wherein the second path comprises a second first-type transistor, which has a first end coupled to the first output end, a second end, and a control end for receiving the inverted input signal, the second path further comprises a second second-type transistor, which has a first end coupled to the second end of the second first-type transistor, a second end coupled to the second output end, and a control end for receiving the input signal; and
   wherein a phase of the inverted input signal is inverse to a phase of the input signal, and the first path and the second path are conducted or non-conducted according to the input signal and the inverted input signal; when the first path is conducted, a first current flows from the first impedance module and passes along the first path to the second impedance module, so that the first impedance module generates a first output signal at the first output end and the second impedance module generates a second output signal at the second output end; when the second path is conducted, a second current flows from the first impedance module and passes along the second path to the second impedance module, so that the first impedance module generates a third output signal at the first output end and the second impedance module generates a fourth output signal at the second output end; the first path and the second path are not conducted simultaneously, and a frequency of a first combination signal generated from combining the first output signal and the third output signal and a frequency of a second combination signal generated from combining the second output signal and the fourth output signal are N times of a frequency of the input signal, where N is a positive rational number.

2. The frequency multiplier according to claim 1, further comprising:
   a capacitor, having one end coupled to the first path and the second path, and one other end coupled to ground.

3. The frequency multiplier according to claim 1, wherein the second end of the first first-type transistor and the second end of the first second-type transistor are not coupled to each other, and the first end of the second first-type transistor and the first end of the second second-type transistor are not coupled to each other.

4. The frequency multiplier according to claim 3, further comprising:
   a first capacitor, having one end coupled to the second end of the first first-type transistor and one other end coupled to ground; and
   a second capacitor, having one end coupled to the second end of the second first-type transistor and one other end coupled to ground.

5. The frequency multiplier according to claim 1, wherein the second end of the first first-type transistor, the second end of the second first-type transistor, the first end of the first second-type transistor and the first end of the second second-type transistor are coupled to a same connection point.

6. The frequency multiplier according to claim 5, further comprising:
   a capacitor, having one end coupled to the connection point and one other end coupled to ground.

7. The frequency multiplier according to claim 1, wherein the first impedance module comprises at least one inductor for generating the first output signal or the third output signal through resonance, and the second impedance module comprises at least one inductor for generating the second output signal or the fourth output signal through resonance.

8. A signal frequency-multiplying method, for a frequency multiplier comprising a first path, a second path, a first impedance module and a second impedance module; the method comprising:
   receiving an input signal and an inverted input signal by the first path and the second path, respectively, wherein a phase of the inverted input signal is inverse to a phase of the input signal, and the first path and the second path are conducted or non-conducted according to the input signal and the inverted input signal;
   when the first path is conducted, rendering a first current to flow from the first impedance module and pass along the first path to enter the second impedance module, so that the first impedance module generates a first output signal at a first output end and the second impedance module generates a second output signal at a second output end;

when the second path is conducted, rendering a second current to flow from the first impedance module and pass along the second path to enter the second impedance module, so that the first impedance module generates a third output signal at the first output end and the second impedance module generates a fourth output signal at the second output end;

generating a first combination signal by combining the first output signal and the third output signal; and generating a second combination signal by combining the second output signal and the fourth output signal;

wherein the first path and the second path are not conducted simultaneously, and a frequency of the first combination signal and a frequency of the second combination signal are N times of a frequency of the input signal, where N is a positive rational number;

wherein the first path comprises a first first-type transistor, which has a first end coupled to the first output end, a second end, and a control end for receiving the input signal, the first path further comprises a first second-type transistor, which has a first end coupled to the second end of the first first-type transistor, a second end coupled to the second output end, and a control end for receiving the inverted input signal; and wherein the second path comprises a second first-type transistor, which has a first end coupled to the first output end, a second end, and a control end for receiving the inverted input signal, the second path further comprises a second second-type transistor, which has a first end coupled to the second end of the second first-type transistor, a second end coupled to the second output end, and a control end for receiving the input signal.

9. The signal frequency-multiplying method according to claim 8, wherein the first impedance module and the second impedance module comprise at least one inductor; the method further comprising:

generating the first output signal or the third output signal through resonance by the inductor of the first impedance module; and generating the second output signal or the fourth output signal through resonance by the inductor of the second impedance module.

10. A frequency multiplier, comprising:

a first output end;

a second output end;

a first impedance module, having one end coupled to a first predetermined potential level and one other end coupled to the first output end;

a second impedance module, having one end coupled to a second predetermined potential level and one other end coupled to the second output end;

a first path, coupled between the first output end and the second output end;

a second path, coupled between the first output end and the second output end;

a first capacitor, having one end coupled to the first path and one other end coupled to ground; and a second capacitor, having one end coupled to the second path and one other end coupled to ground;

wherein the first path and the second path receive an input signal and an inverted input signal, respectively, a phase of the inverted input signal is inverse to a phase of the input signal, and the first path and the second path are conducted or non-conducted according to the input signal and the inverted input signal; when the first path is conducted, a first current flows from the first impedance module and passes along the first path to the second impedance module, so that the first impedance module generates a first output signal at the first output end and the second impedance module generates a second output signal at the second output end; when the second path is conducted, a second current flows from the first impedance module and passes along the second path to the second impedance module, so that the first impedance module generates a third output signal at the first output end and the second impedance module generates a fourth output signal at the second output end; the first path and the second path are not conducted simultaneously, and a frequency of a first combination signal generated from combining the first output signal and the third output signal and a frequency of a second combination signal generated from combining the second output signal and the fourth output signal are N times of a frequency of the input signal, where N is a positive rational number.

11. The frequency multiplier according to claim 10, wherein the first impedance module comprises at least one inductor for generating the first output signal or the third output signal through resonance, and the second impedance module comprises at least one inductor for generating the second output signal or the fourth output signal through resonance.

12. A signal frequency-multiplying method, for a frequency multiplier comprising a first path, a second path, a first impedance module and a second impedance module; the method comprising:

receiving an input signal and an inverted input signal by the first path and the second path, respectively, wherein a phase of the inverted input signal is inverse to a phase of the input signal, and the first path and the second path are conducted or non-conducted according to the input signal and the inverted input signal;

when the first path is conducted, rendering a first current to flow from the first impedance module and pass along the first path to enter the second impedance module, so that the first impedance module generates a first output signal at a first output end and the second impedance module generates a second output signal at a second output end;

when the second path is conducted, rendering a second current to flow from the first impedance module and pass along the second path to enter the second impedance module, so that the first impedance module generates a third output signal at the first output end and the second impedance module generates a fourth output signal at the second output end;

generating a first combination signal by combining the first output signal and the third output signal; and generating a second combination signal by combining the second output signal and the fourth output signal;

wherein the first path and the second path are not conducted simultaneously, and a frequency of the first combination signal and a frequency of the second combination signal are N times of a frequency of the input signal, where N is a positive rational number;

wherein the frequency multiplier further comprises a first capacitor, which has one end coupled to the first path and one other end coupled to ground, and a second capacitor, which has one end coupled to the second path and one other end coupled to ground.

13. The signal frequency-multiplying method according to claim 12, wherein the first impedance module and the second impedance module comprise at least one inductor; the method further comprising:
  generating the first output signal or the third output signal through resonance by the inductor of the first impedance module; and
  generating the second output signal or the fourth output signal through resonance by the inductor of the second impedance module.

* * * * *